(12) United States Patent
Sadd et al.

(10) Patent No.: US 9,659,623 B1
(45) Date of Patent: May 23, 2017

(54) MEMORY HAVING A PLURALITY OF RESISTIVE NON-VOLATILE MEMORY CELLS

(71) Applicant: FREESCALE SEMICONDUCTOR, INC., Austin, TX (US)

(72) Inventors: Michael Sadd, Austin, TX (US); Anirban Roy, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/082,419

(22) Filed: Mar. 28, 2016

(51) Int. Cl.
G11C 13/00 (2006.01)
G11C 11/16 (2006.01)
H01L 27/22 (2006.01)
H01L 23/528 (2006.01)

(52) U.S. Cl.
CPC ...... *G11C 11/1673* (2013.01); *G11C 11/1655* (2013.01); *G11C 11/1657* (2013.01); *H01L 23/528* (2013.01); *H01L 27/228* (2013.01)

(58) Field of Classification Search
CPC .................................................. G11C 11/0002
USPC .......................................................... 365/148
See application file for complete search history.

(56) References Cited

U.S. PATENT DOCUMENTS

| 6,191,989 | B1 | 2/2001 | Luk et al. |
| 6,816,403 | B1 | 11/2004 | Brennan et al. |
| 7,782,651 | B2 * | 8/2010 | Tokunaga ............. G11C 17/16 365/148 |
| 8,027,206 | B2 | 9/2011 | Yoon et al. |
| 8,194,439 | B2 | 6/2012 | Kim et al. |
| 8,509,003 | B2 | 8/2013 | Lin et al. |
| 8,687,412 | B2 | 4/2014 | Chih et al. |
| 9,514,810 | B1 | 12/2016 | Sadd et al. |
| 9,520,173 | B1 | 12/2016 | Baker, Jr. et al. |
| 2010/0208520 | A1 * | 8/2010 | Wang ................. G11C 16/0441 365/185.05 |
| 2011/0122674 | A1 | 5/2011 | Lin et al. |
| 2014/0211550 | A1 | 7/2014 | Sun et al. |
| 2015/0003165 | A1 * | 1/2015 | Yamauchi ............. G11C 11/405 365/185.18 |
| 2015/0213866 | A1 * | 7/2015 | Wu ....................... G11C 11/161 365/158 |

OTHER PUBLICATIONS

Chen, H. et al., "A Nondestructive Self-Reference Scheme for Spin-Transfer Torque Random Access Memory (STT-RAM)", Design, IEEE, Automation & Test in Europe Conference & Exhibition (DATE), Mar. 8-12, 2010, Dresden, pp. 148-153.

(Continued)

*Primary Examiner* — Min Huang

(57) ABSTRACT

A resistive non-volatile memory (NVMN) cell has three select transistors connected together in series. A first resistive element has a first terminal connected between first and second select transistors and a second terminal. A second resistive element has a first terminal connected between second and third transistors. In a first embodiment, the second terminals of the first and second resistive elements are connected to bit lines. In a second embodiment, the second terminals of the first and second resistive elements are connected to source lines. In the first embodiment, when the center select transistor is conductive, the first and second resistive elements become a resistor-divider. Each of the first and second resistive elements include a magnetic tunnel junction (MTJ).

20 Claims, 11 Drawing Sheets

(56) References Cited

OTHER PUBLICATIONS

Smullen IV, C.W., "Designing Giga-Scale Memory Systems with STT-RAM", Presented to the Faculty of the School of Engineering and Applied Science, University of Virginia, Dec. 2011, pp. 1-158.

Na, T. et al., "Reference-Scheme Study and Novel Reference Scheme for Deep Submicrometer STT-RAM", IEEE, Transaction on Circuits and Systems—I: Regular Papers, vol. 61, No. 12, Dec. 2014, pp. 3376-3385.

Huang, K. et al., "Optimization Scheme to Minimize Reference Resistance Distribution of Spin-Transfer-Torque MRAM", IEEE, Transactions on Very Large Scale Integration (VLSI) Systems, vol. 22, Issue: 5, Jul. 3, 2013, pp. 1179-1182.

Zhang, Li et al., "Design and Analysis of the reference cells for STT-RAM", IEICE Electronics Express, vol. 10, No. 12, pp. 1-6.

Tsuchida, K. et al., "A 64Mb MRAM with Clamped-Reference and Adequate-Reference Schemes", Solid-State Circuits Conference Digest of Technical Papers (ISSCC), 2010 IEEE International, San Francisco, CA, Feb. 7-11, 2010, pp. 258-259.

Aoki, M. et al, "A Novel Voltage Sensing 1T/2MTJ Cell with Resistance Ratio for Highly Stable and Scalable MRAM", VLSI Circuits, 2005. Digest of Technical Papers. 2005 Symposium, Jun. 16-18, 2005, pp. 170-171.

Yu, H-C. et al., "New Circuit Design Architecture for a 300-MHz 40nm 1Mb Embedded STT-MRAM with Great Immunity to PVT Variation", 2012 International Conference on Solid-State and Integrated Circuit, IPCSIT, vol. 32, IACSIT Press, Singapore, pp. 57-61.

Xu, W. et al., "Design of Spin Torque Transfer Magnetoresistive RAM and CAM/TCAM with High Sensing and Search Speed", IEEE, Transactions on Very Large Scale Integration (VLSI) Systems, vol. 18, Issue: 1, Mar. 27, 2009, pp. 66-74.

Kawasumi, A. et al., "Circuit Techniques in Realizing Voltage-generator-less STT MRAM Suitable for Normally-off-type Non-volatile L2 Cache Memory", IEEE, Memory Workshop (IMW), 2013 5th IEEE International, Monterey, CA, May 26-29, 2013, pp. 76-79.

U.S. Appl. No. 14/924,269, Morton, B. et al., "Sense Path Circuitry Suitable for Magnetic Tunnel Junction Memories", filed on Oct. 27, 2015.

\* cited by examiner

MEMORY HAVING A PLURALITY OF RESISTIVE NON-VOLATILE MEMORY CELLS

BACKGROUND

Field

This disclosure relates generally to electronic circuits and more specifically to a resistive non-volatile memory (RNVM).

Related Art

Non-volatile memories retain their stored states when power is removed, and have become important in a number of applications. However, typically, non-volatile memories have characteristics that make them difficult to use, such as slow program and erase operations, inability to erase one bit at a time, and high voltage requirements for programming. Some resistive non-volatile memories overcome these difficulties, such as magnetic random access memory (MRAM), making MRAM a candidate for use as a random access memory. MRAM stores a memory state by changing a resistance of a resistive element called a magnetic tunnel junction (MTJ). One problem with MRAM is that the difference in resistance between a low state and a high state of the MTJ may be very small, making it difficult to reliably sense the stored state. Variation in resistance values across an array, caused by for example, layout, process, and temperature changes, may be significant. The resistance variation across the MTJs of the array may be large enough to cause a sensed voltage across the MTJ to overlap a fixed reference voltage, making sensing the stored state impossible.

Therefore, a need exists for a RNVM and method of operation that solves the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
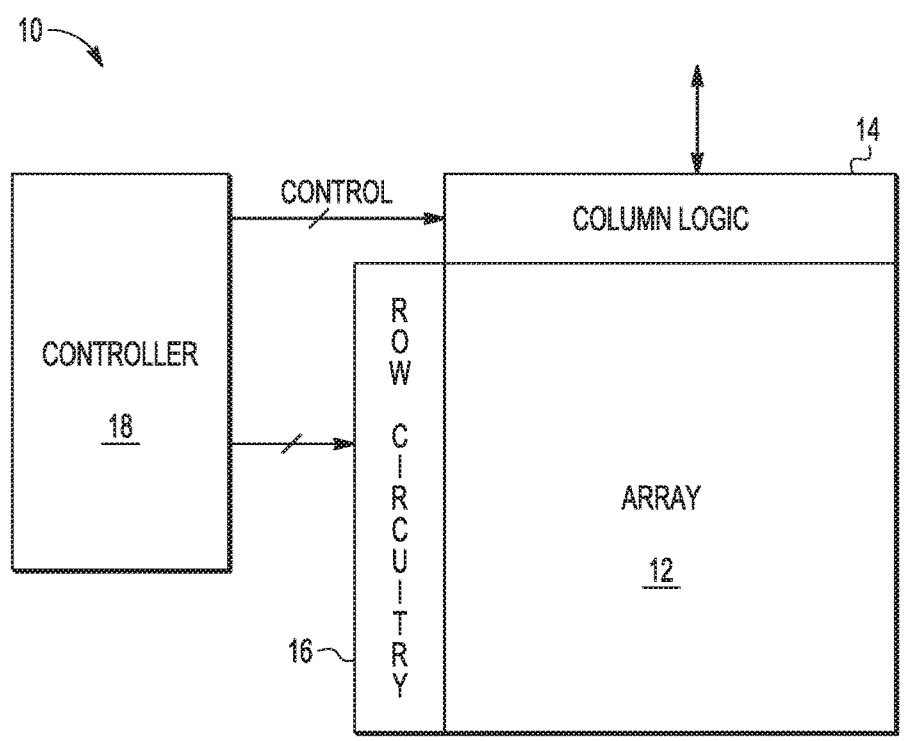
FIG. 1 illustrates, in block diagram form, a non-volatile memory in accordance with an embodiment.

Generally, there is provided, a resistive non-volatile memory (RNVM). Each memory cell of an RNVM array includes three access transistors and two resistive elements. The three access transistors are connected together in series and have a first resistive element connected between a first transistor and a second transistor and a second resistive element connected between the second transistor and a third transistor. In one embodiment, a bit line is connected to each end of the series-connection of transistors and a source line is connected to each resistive element. In another embodiment, a bit line is connected to the end of each resistive element and source lines are connected to each end of the series-connected of transistors. There are three word lines, one word line connected to a control electrode of each of the three transistors. In one embodiment, the two resistive elements are MTJs. In a programmed memory cell, one MTJ element has a relatively high resistance and the other MTJ element has a lower resistance. A capacitor may be coupled to each bit line of a column, or may be shared by multiple columns. A read operation of the programmed memory cell includes two phases. In one embodiment, a read operation includes a calibrate phase and a sense phase. During the calibrate phase, the source lines and bit lines are precharged to a reference voltage level and an inverting amplifier is calibrated to a trip voltage level by shorting the inverting amplifier input and output together. The sense phase follows the calibrate phase. During the sense phase, the inverting amplifier short circuit is removed, or opened, and a voltage offset is added to the reference voltage on one source line and subtracted from the reference voltage on the other source line. A change in voltage caused by the different programmed resistance values of the MTJ elements is sensed by the sense amplifier through the capacitors. In another embodiment, during a first phase, one MTJ element is sensed and a voltage set on a capacitor. During a second phase, the complementary programmed MTJ element is sensed and a voltage from the second MTJ element is applied to the capacitor MTJ element.

The embodiments of the resistive non-volatile memory nulls amplifier offset voltages resulting in more reliable read operations. Using three access transistors with two MTJ elements allows selection of columns for read operations without drawing current on an entire word line or word line segment.

In one embodiment, there is provided, a memory comprising: a plurality of resistive non-volatile memory (RNVM) cells, each RNVM cell comprising: a first transistor having a first current element coupled to a first conductor, a control electrode coupled to a second conductor, and a second current electrode; a second transistor having a first current electrode coupled to the second current electrode of the first transistor, a control electrode coupled to a third conductor, and a second current electrode; a third transistor having a first current electrode coupled to the second current electrode of the second transistor, a control electrode coupled to a fourth conductor, and a second current electrode coupled to a fifth conductor; a first RNVM element having a first terminal coupled to a sixth conductor, and a second terminal coupled to the second current electrode of the first transistor; and a second RNVM element having a first terminal coupled to the first current electrode of the third transistor, and a second terminal coupled to a seventh conductor, wherein the second transistor is conductive during one operation and the second transistor is substantially non-conductive during a different operation. The first and fifth conductors may be characterized as being bit lines. The second, third, and fourth conductors may be characterized as being word lines, and the sixth and seventh conductors are characterized as being source lines. A read operation of the memory may have a calibration phase and a sense phase, wherein during the calibration phase the first, second, and third transistors are conductive, a reference voltage is applied to both source lines, and wherein during the sense phase, the first, second, and third transistors are conductive, and one source line has the reference voltage plus an offset voltage and the other source line has the reference voltage minus the offset. The memory may further comprise a first capacitor coupled to the first conductor, and a second capacitor coupled to the fifth conductor. The memory may further comprise an amplifier coupled to the first and second capacitors. The first and fifth conductors may be characterized as being source lines, the second, third, and fourth conductors may be characterized as being word lines, the sixth conductor may be characterized as being a first bit line and seventh conductor may be characterized as being a second bit line. The memory may further comprise a capacitor, wherein the first and second bit lines may be selectively coupled to a capacitor. During a read operation of a memory cell, the read operation having a first phase and a second phase, wherein during the first phase one of the first bit line or the second bit line are coupled to the capacitor while the other bit line is coupled to ground, and during the second phase a third bit line of a reference memory cell is coupled to the capacitor while a fourth bit line of the reference memory cell is coupled to ground. The memory may further comprise an amplifier coupled to the capacitor. The first and second RNVM elements may each comprise magnetic tunnel junctions.

In another embodiment, there is provided, a memory comprising: a plurality of resistive non-volatile memory (RNVM) cells organized in rows and columns, each of the RNVM cells comprising first, second, and third transistors and first and second resistive elements, the first, second, and third transistors coupled together in series, wherein a control electrode of each of the first, second, and third transistors is coupled to one of first, second, and third word lines, a current electrode of the first transistor is coupled to a first conductor and a current of the third transistor is coupled to a second conductor, a first terminal of the first resistive element is coupled to a first junction between the first and second transistors and a first terminal of the second resistive element is coupled to a second junction between the second and third transistors, a second terminal of the first resistive element is coupled to a third conductor and a second terminal of the second resistive element is coupled to a fourth conductor, wherein the second transistor is conductive during one operation and the second transistor is substantially non-conductive during a different operation; and an output circuit coupled to the plurality of RNVM cells for providing output data during a read operation of the memory. The first and second conductors may be characterized as being first and second bit lines, respectively, and the third and fourth conductors may be characterized as being source lines. The first and second conductors may be characterized as being source lines, and the third and fourth conductors may be characterized as being bit lines. The first and second resistive elements may each comprise magnetic tunnel junctions. The memory may further comprise a read operation having a first phase and a second phase, wherein during the first phase a reference voltage is set on a capacitor, and during the second phase a voltage corresponding to a stored state is provided to the capacitor. The first and second conductors may each be bit lines, and further comprising a first capacitor coupled to the first conductor and a second capacitor coupled to the second conductor. The third and fourth conductors may each be a bit line, and the memory may further comprise a capacitor selectively coupled to one of the third and fourth conductors.

In yet another embodiment, a memory comprising: a plurality of non-volatile memory cells organized in rows and columns, each memory cell comprising: a first transistor having a first current element coupled to a first conductor, a control electrode coupled to a second conductor, and a second current electrode; a second transistor having a first current electrode coupled to the second current electrode of the first transistor, a control electrode coupled to a third conductor, and a second current electrode; a third transistor having a first current electrode coupled to the second current electrode of the second transistor, a control electrode coupled to a fourth conductor, and a second current electrode coupled to a fifth conductor; a first magnetic tunnel junction (MTJ) element having a first terminal coupled to a sixth conductor, and a second terminal coupled to the second current electrode of the first transistor; and a second MTJ element having a first terminal coupled to the first current electrode of the third transistor, and a second terminal coupled to a seventh conductor, wherein the second transistor is conductive during one operation and the second transistor is substantially non-conductive during a different operation; and an output circuit coupled to the plurality of non-volatile memory cells, the output circuit comprising a capacitor selectively coupled to one of the first and second MTJ elements of a memory cell selected for a read operation. The first and fifth conductors may be characterized as being bit lines, the second, third, and fourth conductors may be characterized as being word lines, and the sixth and seventh conductors may be characterized as being source lines. The first and fifth conductors may be characterized as being source lines, the second, third, and fourth conductors may be characterized as being word lines, the sixth conductor may be characterized as being a first bit line and seventh conductor may be characterized as being a second bit line.

Figure 2:
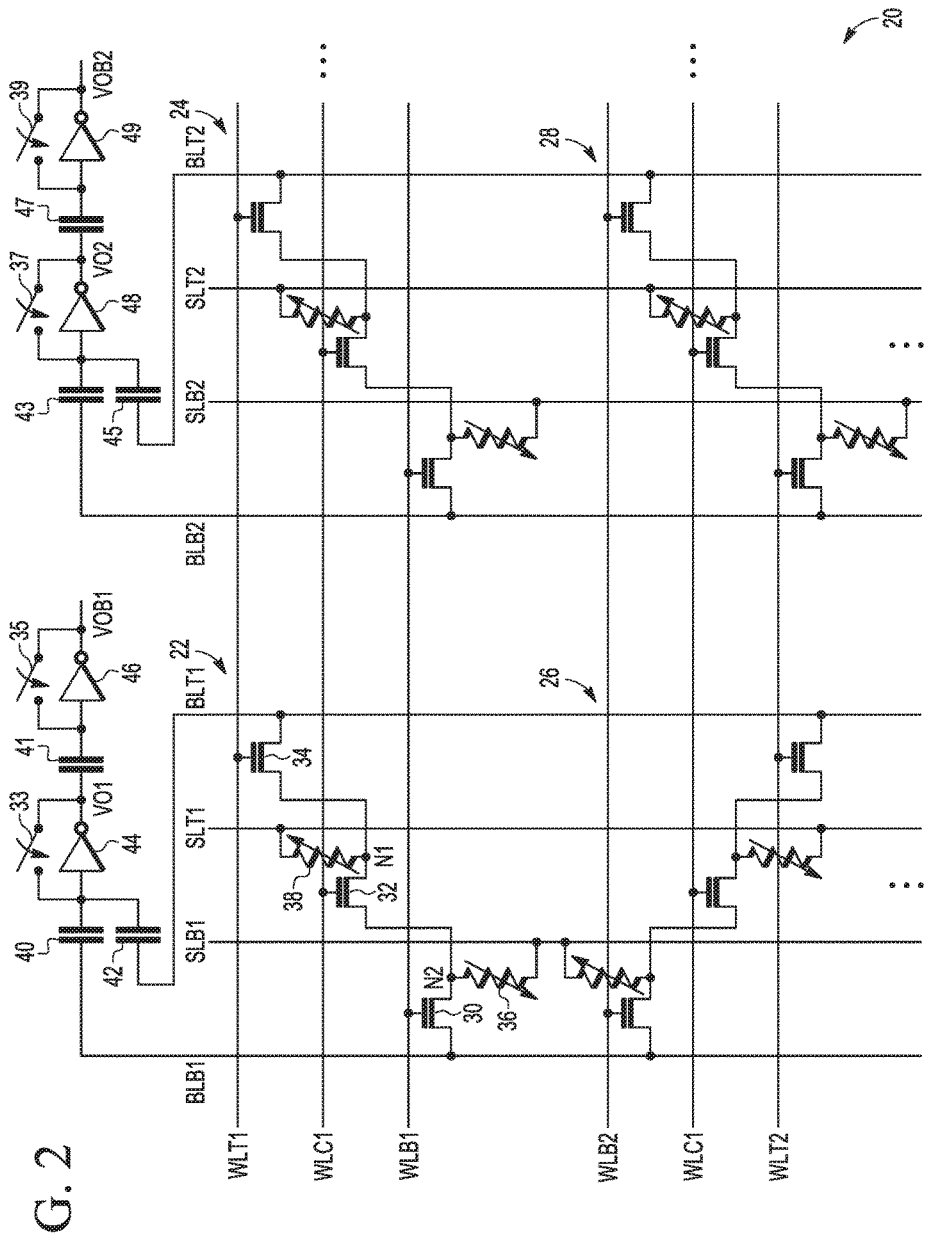
FIG. 2 illustrates, in schematic diagram form, an array of resistive non-volatile memory cells of the non-volatile memory of FIG. 1 in accordance with one embodiment.

FIG. 1 illustrates, in block diagram form, a simplified view of RNVM 10 in accordance with an embodiment. RNVM 10 may be implemented on an integrated circuit using a conventional integrated circuit manufacturing process such as complementary metal-oxide semiconductor (CMOS). RNVM 10 may be a stand-alone memory or may be integrated with other circuitry such as a microcontroller or microprocessor. Resistive non-volatile memory 10 includes array of memory cells 12, column logic 14, row circuitry 16, and controller 18. Array of memory cells 12 includes a plurality of MRAM cells organized in rows and columns. A row of memory cells includes a word line and all of the memory cells coupled to the word line. In the embodiment of FIG. 2, a row is divided into segments having a word line segment and the memory cells coupled to the word line segment. In FIG. 1, a column of memory cells includes a bit line and all of the memory cells coupled to the bit line. Row circuitry 16 is coupled to the word lines and provides row decoders and word line drivers for selecting and driving a selected word line. Column logic 14 is coupled to the bit lines and includes column decoders and input/output circuits. The column decoders select one or more bit lines and the input/output circuits provides data signals from selected memory cells to be read, or receives data signals to be programmed into selected memory cells. Controller 18 provides control and address information labeled "CONTROL" to column logic 14 and row circuitry 16 for controlling the operation of memory 10. One or more control signals labeled "CONTROL" is provided to control various switches in the illustrated embodiments. In other embodiments, controller 18 may be implemented separately from memory 10. For example, controller 18 may be part of a processor coupled to RNVM 10. Also, controller 18 may be part of a different integrated circuit.

FIG. 2 illustrates, in schematic diagram form, array 20 having a plurality of RNVM cells in accordance with one embodiment. Array 12 of FIG. 1 may be implemented using the RNVM cells of array 20. FIG. 2 illustrates representative RNVM cells 22, 24, 26, and 28 organized in rows and columns. A row includes three word lines and the memory cells coupled to the three word lines. A column includes a bit line pair and a source line pair and the corresponding memory cells. As an example, RNVM cell 22 includes transistors 30, 32, and 34 and resistive elements 36 and 38. All of the other RNVM cells in array 20 are the same in the illustrated embodiment. Transistor 30 has a first current electrode connected to a bottom bit line labeled "BLB1", a control electrode coupled to a bottom word line labeled "WLB1", and a second current electrode connected to a node N2. Transistor 32 has a first current electrode connected to the second current electrode of transistor 30, a control electrode connected to a center word line labeled "WLC1", and a second current electrode connected to a node N1. Transistor 34 has a first current electrode connected to the second current electrode of transistor 32, a control electrode connected to a top word line labeled "WLT1", and a second current electrode connected to a top bit line labeled "BLT1". Resistive element 36 has a first terminal connected to node N2, and a second terminal connected to a bottom source line labeled "SLB1". Resistive element 38 has a first terminal connected to node N1, and a second terminal connected to a top source line labeled "SLT1". Resistive elements 36 and 38 may have magnetic tunnel junctions.

In FIG. 2, each bit line is connected to a capacitor. For example, bottom bit line BLB1 is connected to a first terminal of capacitor 40 and bit line BLT1 is coupled to a first terminal of capacitor 42. The second terminals of capacitors 40 and 42 are connected together and to an input of inverting amplifier 44. In one embodiment, the inverting amplifier is an inverter. In another embodiment, the inverting amplifier may be any amplifier where the output is amplified to an opposite polarity from the input. Also, bottom bit line BLB2 is connected to a first terminal of capacitor 43 and top bit line BLT2 is connected to a first terminal of capacitor 45. The second terminals of capacitors 43 and 45 are connected together and to an input of inverting amplifier 48. Each of the inverting amplifiers 44, 46, 48, and 49 have a switch 33, 35, 37, and 39, respectively, for selectively shorting the input to the output. A capacitor 41 is connected between amplifiers 44 and 46 and a capacitor 47 is connected between amplifiers 48 and 49. An output voltage of amplifier 44 is labeled "VO1" and an output voltage of amplifier 46 is labeled "VOB1". An output voltage of amplifier 48 is labeled "VO2" and an output voltage of amplifier 49 is labeled "VOB2". Note that capacitors 40, 42, 43, and 45, amplifiers 44, 46, 48, and 49, and the shorting switches 33, 35, 37, and 39 may be implemented as a part of column logic 14 (FIG. 1). Switches 33, 35, 37, and 39 may be implemented as transmission gates or single transistors, and receive a control signal CONTROL from controller 18. Two amplifiers are provided to add gain to the sensed signal from each bit line pair. In other embodiments, more or fewer amplifiers may be used.

Resistive elements 36 and 38 form a resistor-divider when the center word line enables the center transistor 32. The center transistor 32 will be conductive when a sufficient positive bias, for example, VDD is applied to the center word line, but will be substantially non-conductive when zero volts or ground is applied to the center word line Capacitors 40 and 42 are matched to cancel the parasitic resistance of the middle transistor 32 so that the signal seen at the input of the inverting amplifier 44 is proportional to the resistance difference of the complementary resistors forming the resistor divider.

Figure 3:
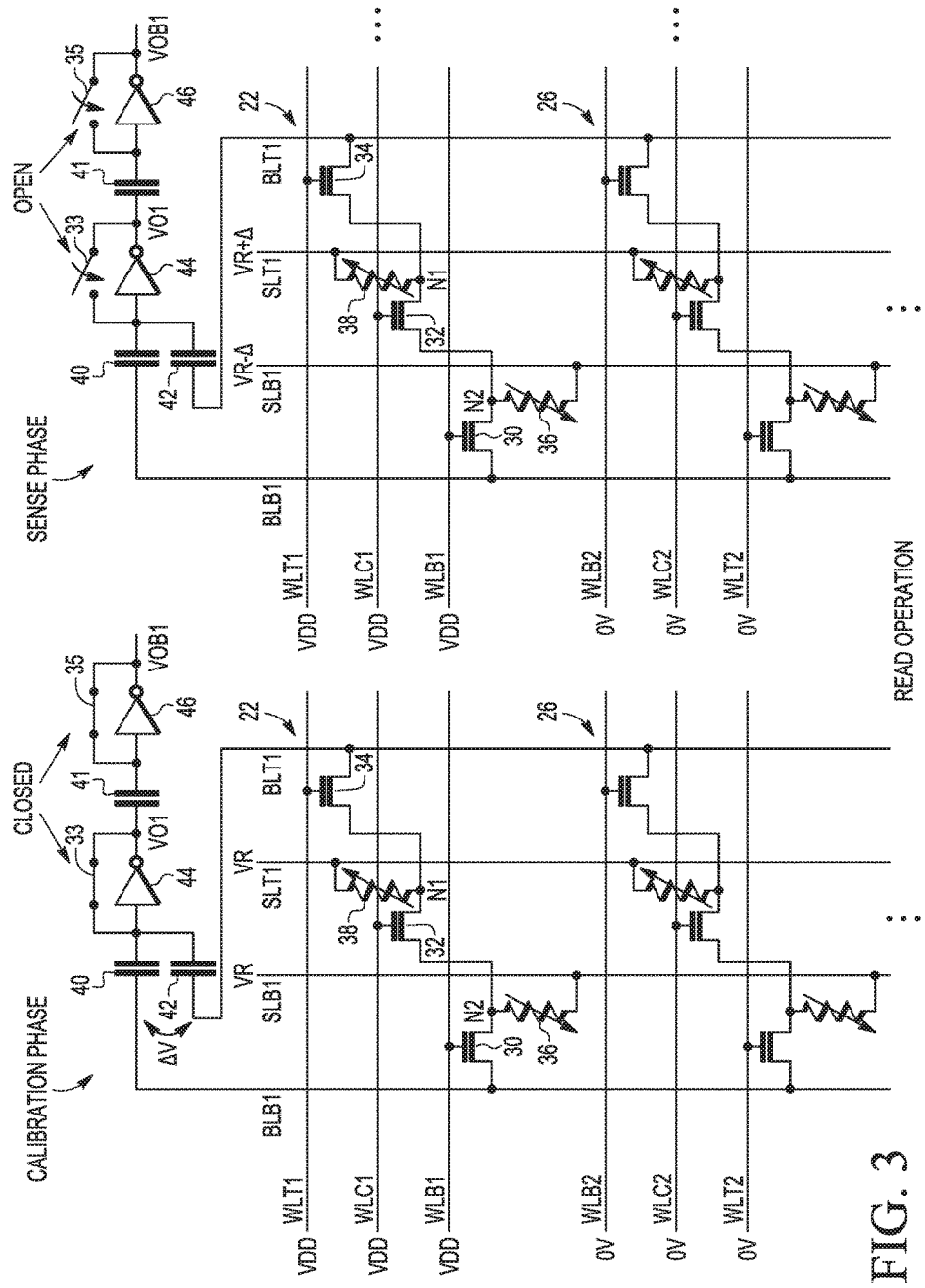
FIG. 3 illustrates a method for reading a memory cell of the array of FIG. 2 in accordance with an embodiment.
Figure 4:
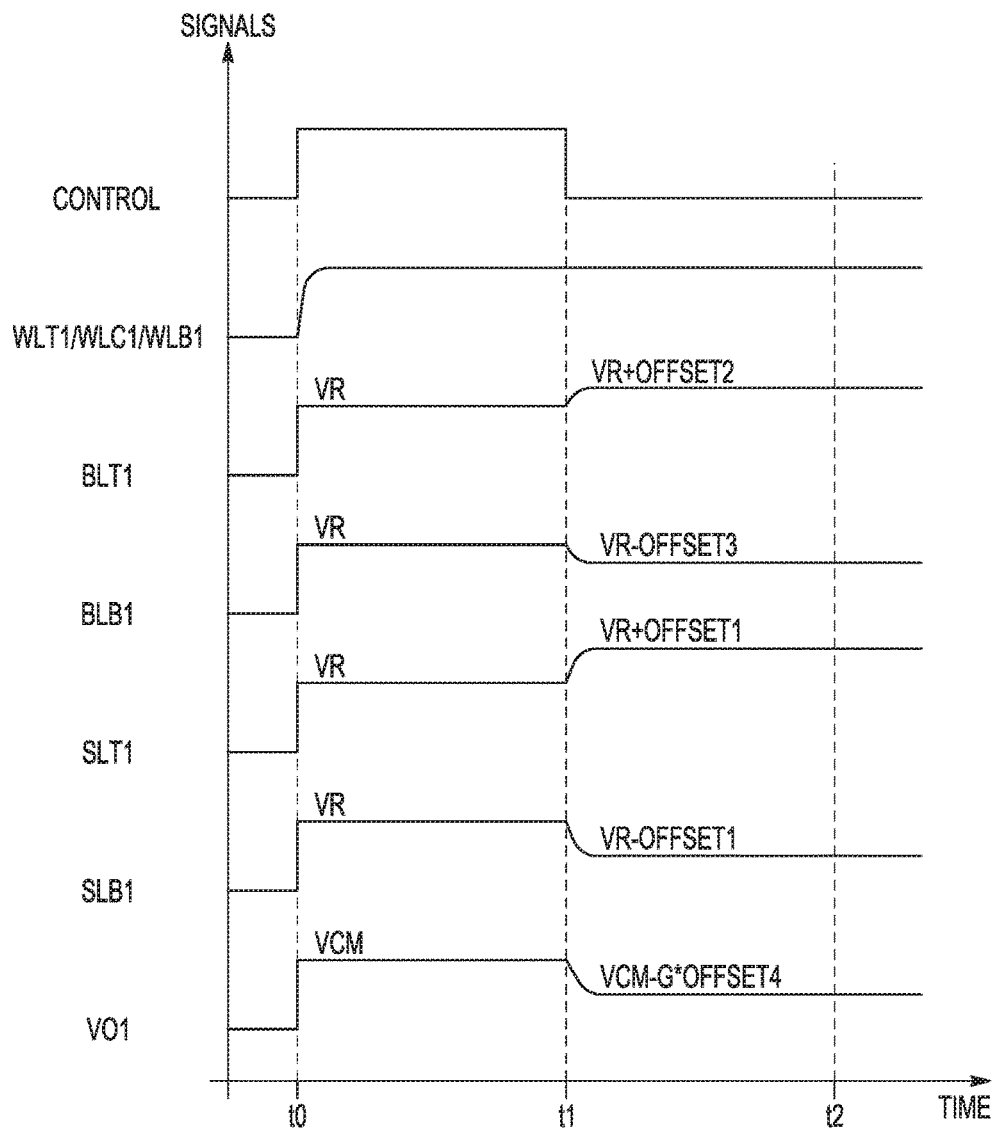
FIG. 4 illustrates a timing diagram of various signals used for the read operation of FIG. 3.

FIG. 3 illustrates a read operation of a memory cell of array 20 of FIG. 2 in accordance with an embodiment. The read operation of FIG. 3 includes a CALIBRATION PHASE and a SENSE PHASE. FIG. 4 illustrates a timing diagram of various signals used for the read operation of FIG. 3. The read operation will be described referring to both FIG. 3 and FIG. 4. The CALIBRATION PHASE begins with the assertion of control signal CONTROL at time t0. Prior to time t0, all of the signals in FIG. 4 are shown at zero volts. That may or may not be the case in an actual implementation. At time t0, a logic high control signal CONTROL causes switches 33 and 35 to close, initializing, or precharging, inverting amplifiers 44 and 46 to a trip voltage level by shorting the inverting amplifiers inputs and outputs together. A RNVM cell is selected, such as cell 22, by providing an address that selects a row and a column. In this case, all three word lines WLT1, WLC1, and WLT1 are asserted as a predetermined voltage, for example, a power supply voltage labeled "VDD" in FIG. 3 provided to RNVM 10. Bit lines BLB1 and BLT1 and source lines SLT1 and SLB1 are initialized at a reference voltage labeled "VR". Output voltage VO1 initializes to a common mode voltage level labeled "VCM" by closing the switch 33. In one embodiment, the common mode voltage VCM is set to be approximately at the mid-point of a voltage swing from a logic high to a logic low.

The SENSE PHASE begins at time t1. During the SENSE PHASE, switches 33 and 35 are opened, removing the short circuit across inverting amplifiers 44 and 46. A voltage offset (Δ) is added to reference voltage VR on one source line and subtracted from the reference voltage VR on the other source line. The offset Δ may be established by the maximum read voltage across a resistive element without having read disturb. For example, top source line SLT1 receives reference voltage VR plus an offset voltage labeled "OFFSET1" and bottom source line SLB1 receives reference voltage VR minus offset voltage OFFSET1. Offset voltage OFFSET1 may be equal to about Δ. Because of the offset difference between SLT1 and SLB1, current will flow through resistive elements 36 and 38 and transistor 32 on the selected row because transistor 32 is conductive. On unselected rows the center select transistor of a cell is substantially non-conductive. Therefore, current will not flow through the center select transistor of unselected rows reducing power consumption. Likewise, top bit line BLT1 reaches a voltage equal to reference voltage VR plus an offset voltage labeled OFFSET2. In the illustrated embodiment, OFFSET2 is equal to about Δ(R36+R32−R38)/(R36+R32+R38) and OFFSET3 is equal to about Δ(R38+R32−R36)/(R36+R32+

R38), where R represents a resistance value and the number is the reference number of the corresponding component. The sensed output voltage VO1 will become the common mode voltage VCM plus or minus the voltage of the sensed logic state. For example, for a sensed logic low voltage, output voltage VO1 becomes VCM−G*OFFSET4, where G is the gain of inverting amplifier 44 and OFFSET4 is equal to about Δ(R36−R38)/(R36+R32+R38). The read operation ends at time t2. During the sense phase, the unselected columns are effectively held in the calibrate phase with no current flow.

Figure 5:
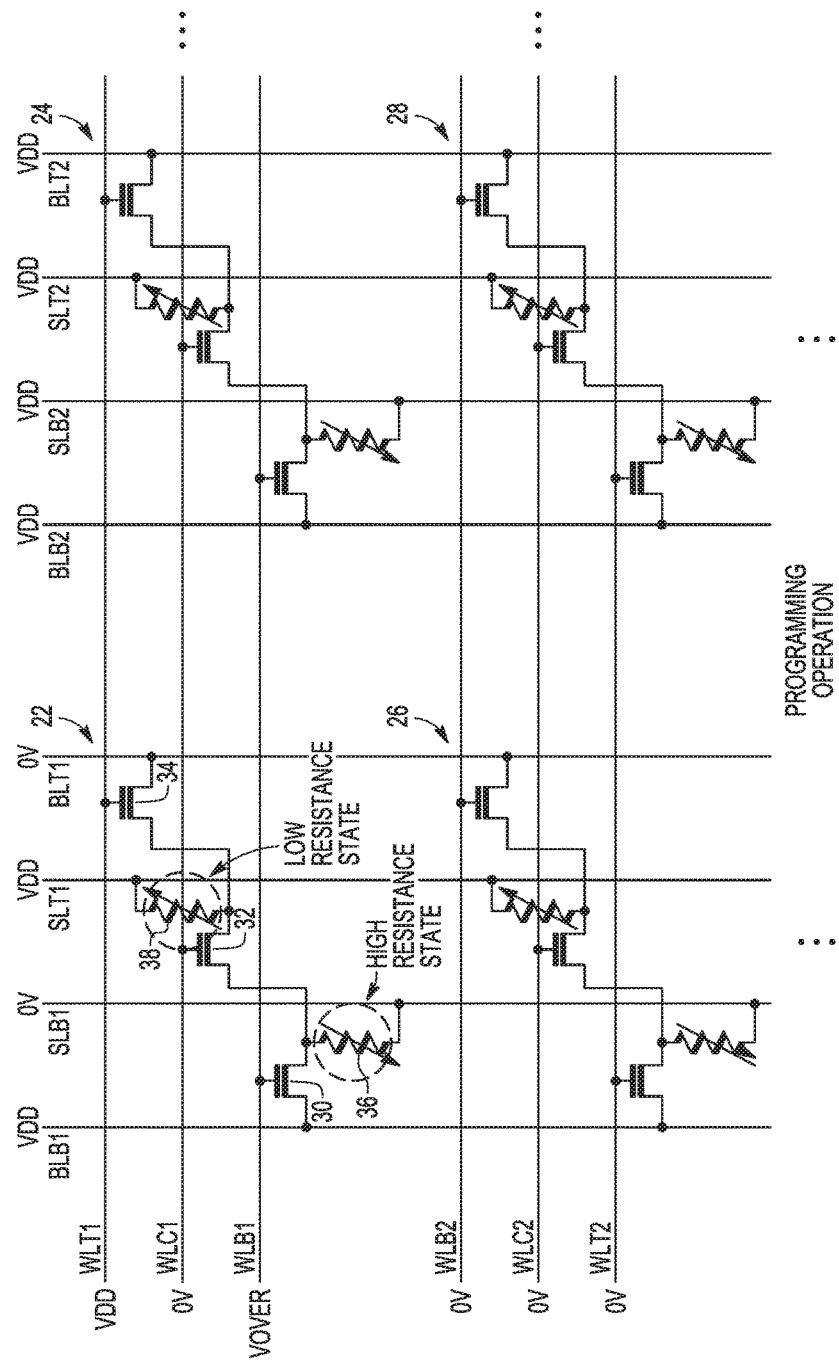
FIG. 5 illustrates a method for programming a memory cell of the array of FIG. 2 in accordance with an embodiment.

FIG. 5 illustrates a programming operation of an RNVM cell of the array of FIG. 2 in accordance with an embodiment. A bit is programmed into a cell of array 20 by changing a resistance of the MTJs. As an example, RNVM cell 22 is programmed so that resistive element 36 has a high resistance state and resistive element 38 has a low resistance state. The power supply voltage VDD is provided to top word line WLT1. The center word line WLC1 is not selected, and receives zero volts so that the center transistor 32 is substantially non-conductive. The bottom word line WLB1 is provided with a voltage VOVER which is greater than power supply voltage VDD. The word lines of unselected rows are held at zero volts and the source and bit lines of unselected columns are held at VDD. Power supply voltage VDD is provided to bottom bit line BLB1, and zero volts is applied to top bit line BLT1. Voltage VOVER on bottom word line WLB1 causes select transistor 30 to be conductive so that a current through transistor 30 and resistive element 36 will cause the resistance of resistive element 36 to change if necessary. Also, voltage VDD on word line WLT1 will cause select transistor 34 to be conductive so that a current opposite the current through resistive element 36 will flow through resistive element 38. Resistive element 38 is programmed to have a resistance value opposite the resistance value programmed into resistive element 36.

Figure 6:
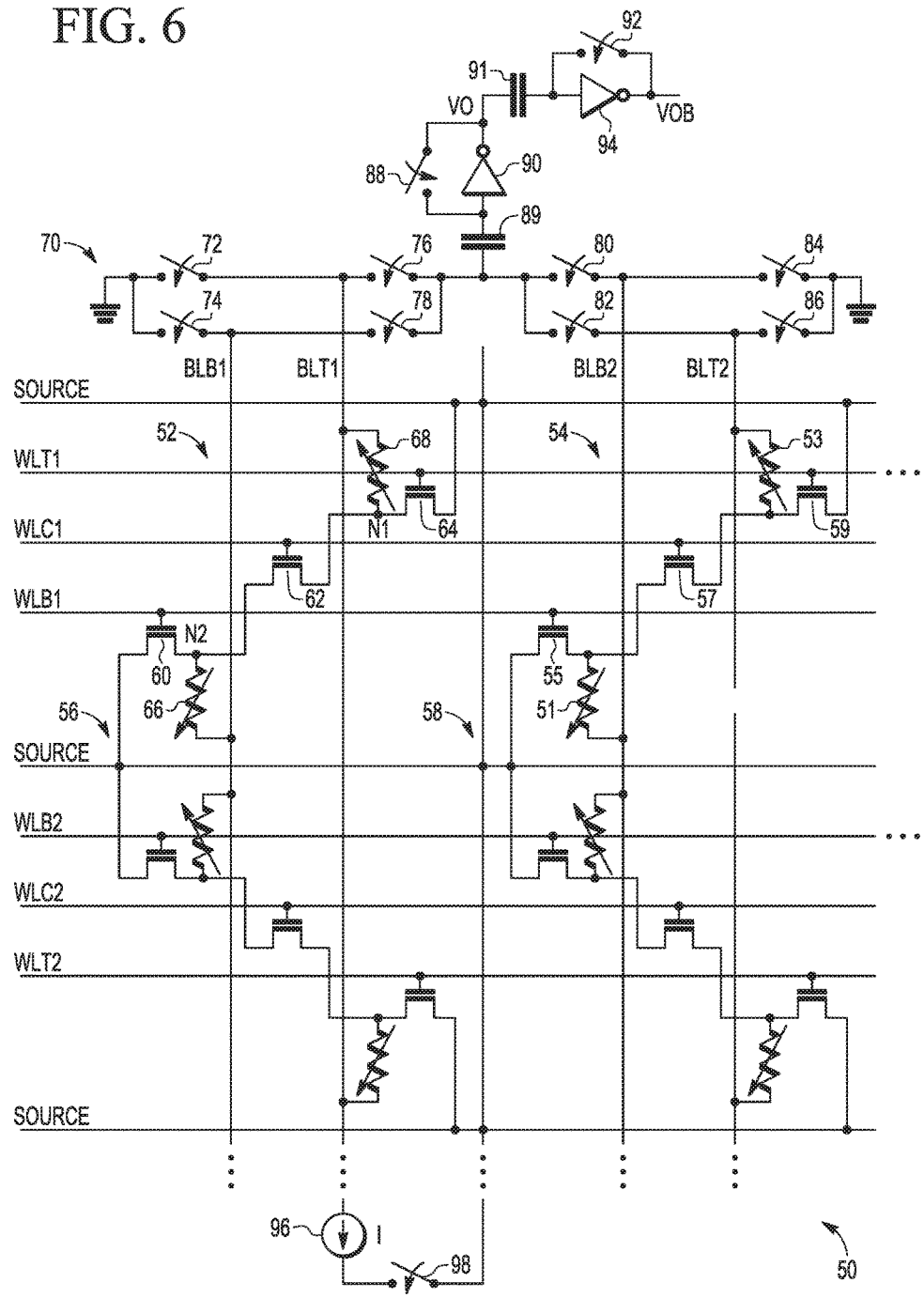
FIG. 6 illustrates, in schematic diagram form, an array of resistive non-volatile memory cells of the non-volatile memory of FIG. 1 in accordance with another embodiment.

FIG. 6 illustrates, in schematic diagram form, array 50 of a plurality of RNVM cells in accordance with another embodiment. Array 12 of FIG. 1 may be implemented using the RNVM cells of array 50. FIG. 6 illustrates representative RNVM cells 52, 54, 56, and 58 organized in rows and columns. A row includes three word lines and the memory cells coupled to the three word lines. A column includes a bit line pair and a source line pair and the corresponding memory cells connected to the bit line pair and the source line pair. As an example, RNVM cell 52 includes transistors 60, 62, and 64, and resistive elements 66 and 68. RNVM cell 54 includes transistors 55, 57, and 59 and resistive elements 51 and 53. All of the RNVM cells in array 50 are the same in the illustrated embodiment. Transistor 60 has a first current electrode connected to a source line labeled "SOURCE", a control electrode connected to a bottom word line labeled "WLB1", and a second current electrode at node N2. Transistor 62 has a first current electrode connected to the second current electrode of transistor 60, a control electrode connected to center word line labeled "WLC1", and a second current electrode at node N1. Transistor 64 has a first current electrode connected to the second current electrode of transistor 62, a control electrode connected to a top word line labeled "WLT1", and a second current electrode connected to source line SOURCE. Resistive element 66 has a first terminal connected to node N2, and a second terminal connected to a bottom bit line labeled "BLB1". Resistive elements 66 and 68 may have magnetic tunnel junctions.

A switch network 70 is also shown in FIG. 6 including switches 72, 74, 76, 78, 80, 82, 84, and 86. The switches are controlled by one or more control signal CONTROL from controller 18. Switch network 70, capacitors 89 and 91, inverting amplifiers 90 and 94, and current source 96 and switch 98 may be implemented as part of column logic 14 (FIG. 1). Instead of having a capacitor and amplifier connected to each bit line pair (column) as illustrated in the embodiment of FIG. 2, array 50 has one capacitor that is shared between a two bit line pairs. Capacitor 89 has a first terminal connected to switch network 70, and a second terminal connected to an input of amplifier 90. Switch network 70 is used to connect the bit lines of array 70 to either ground or to capacitor 89. Switch 88 is used to short the input and output terminals of amplifier 90 in response to control signal CONTROL from controller 18, and switch 92 is used to short the input and output terminals of amplifier 94 in response to control signal CONTROL. An output of amplifier 90 is labeled "VO", and an output of amplifier 94 is labeled "VOB". Two amplifiers 90 and 94 are provided to add gain to the sensed signal. In other embodiments, more or fewer amplifiers may be used. Current source 96 provides a current I through switch 98 during a read operation as described below.

In the illustrated embodiment of FIG. 6, the source lines SOURCE are shared between a number of cells by running the source line in the horizontal direction and then strapping the source line vertically. In another embodiment, there may be only one source line with no vertical strapping. During sensing, current flows from the source line current source 96 to the selected word line transistor to the corresponding resistive element and then the bit line that is connected to the resistive element and to ground. A secondary current path is formed through the selected center transistor to the other bit line of the bit line pair to provide a voltage to capacitor 89.

Figure 7:
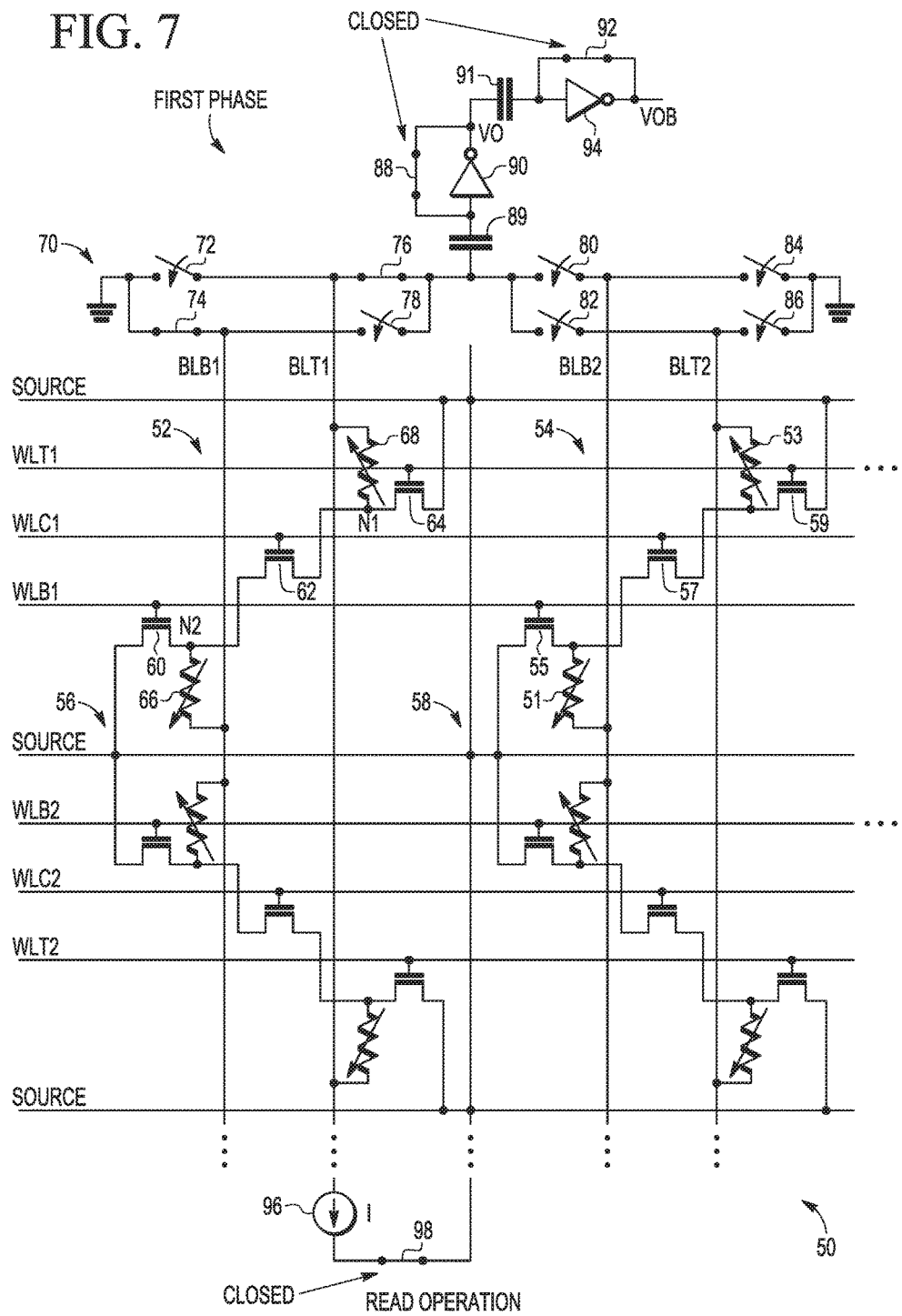
FIG. 7 illustrates a first phase of a method for reading a memory cell of the array of FIG. 6 in accordance with an embodiment.
Figure 8:
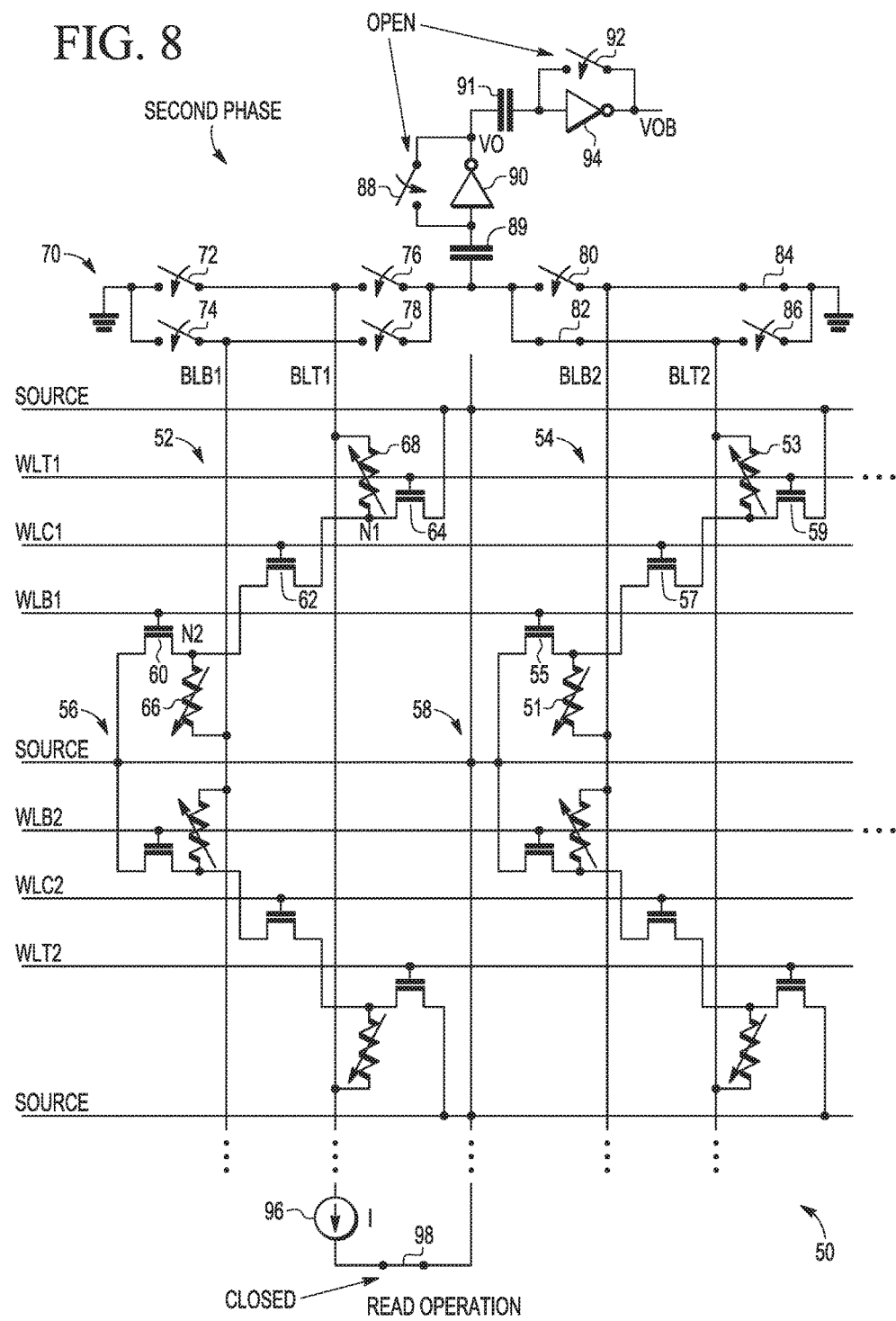
FIG. 8 illustrates a second phase of a method for reading a memory cell of the array of FIG. 6 in accordance with an embodiment.
Figure 9:
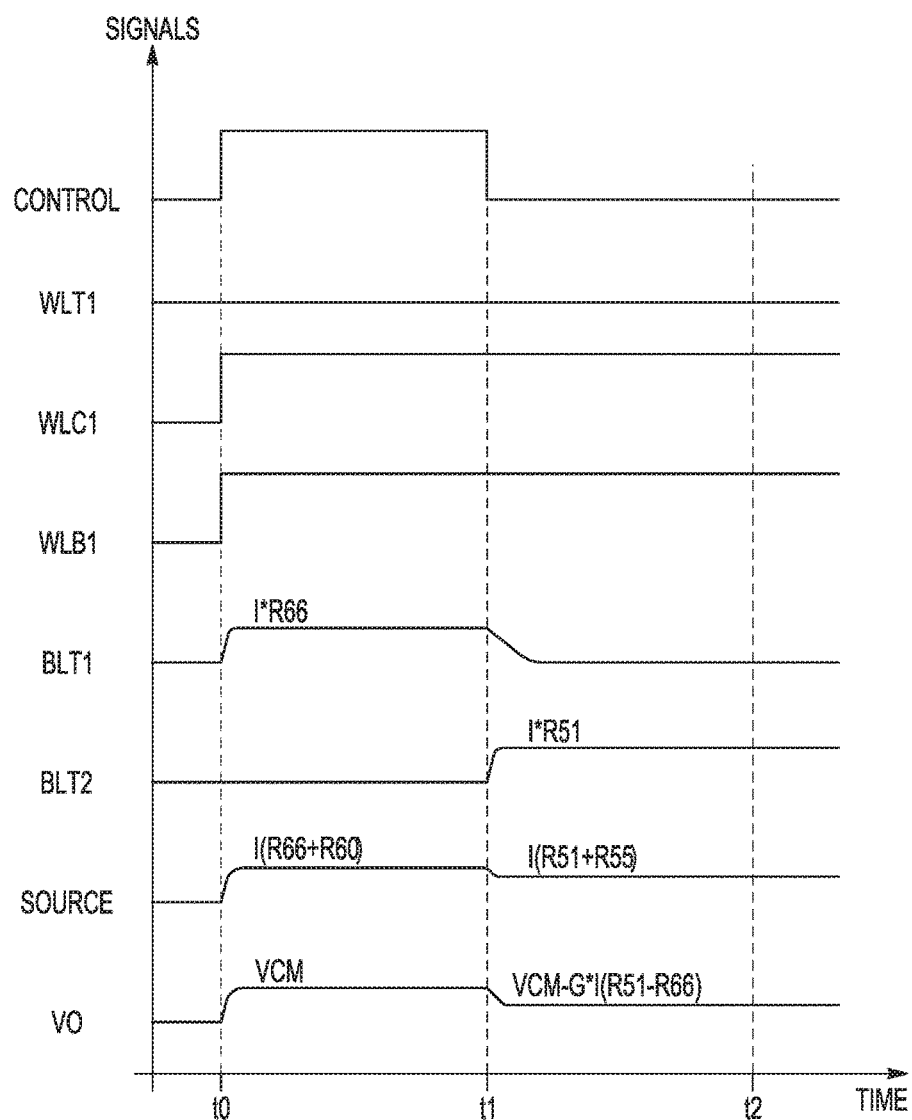
FIG. 9 illustrates a timing diagram of various signals used for the read operation of FIG. 7 FIG. 8.

FIG. 7 illustrates a first phase of a read operation of a memory cell of the array 50 of FIG. 6 in accordance with an embodiment. The read operation includes a first phase (FIRST PHASE) and a second phase (SECOND PHASE). FIG. 8 illustrates a second phase of a method for reading a memory cell of the array of FIG. 6 in accordance with an embodiment. FIG. 9 illustrates a timing diagram of various signals used for the read operation of FIG. 7 and FIG. 8. The read operation will be described with reference to both FIGS. 7-9. The first phase begins at time to. Prior to time t0, all of the signals are illustrated at zero volts. At time t0, a logic high control signal CONTROL cause switches 88 and 92 to close and short the input and output terminals of amplifiers 90 and 94, initialize and amplifiers 88 and 92 to a trip voltage level. For purposes of illustration, the read operation will be of cell 52. In this embodiment, a reference cell is used during the read operation. During the first phase, switch 74 is closed connecting bottom bit line BLB1 to ground and switch 76 is closed connecting top bit line BLT1 to capacitor 89. An initial voltage is provided to capacitor 89. All of the other switches are open. Any cell in array 50 can be the reference cell, but to minimize the effect of process and temperature variation, a cell near the cell being read is preferred. In this example, cell 54 will function as the reference cell. Also at time t0, top word line WLT1 is negated at zero volts, center word line WLC1 is asserted at VDD, and bottom word line WLB1 is asserted at VDD. Because the center word line WLC1 is at VDD, the center transistor 62 is conductive. The other unselected word lines of the array are at zero volts so that the center transistor in the unselected rows are substantially non-conductive. Switch 98 closes to provide current I to the source lines. A voltage on top bit line BLT1 is equal to current I*R66. The source line SOURCE will have a voltage equal to I(R66+R60), and output voltage VO will be equal to the common mode voltage VCM. The common mode voltage VCM may be half way between a logic high voltage and a logic low voltage.

Time t1 begins the second phase of a read operation. The second phase reads the voltage of the cell that has been chosen to be the reference. At time t1, the word lines remain as initially set. The switches shorting amplifiers 90 and 94 open. Switch 82 closes connecting bit line BLT2 to capacitor 89 and switch 84 closes connecting bottom bit line BLB2 to ground. All of the other switches are open. The voltage on top bit line BLT2 reaches a voltage equal to about I*R51. The source voltage becomes I(R51+R55). Note the slight drop in voltage at time t1 is due to the parasitic resistance of the select transistor 55. The parasitic resistance of the select transistor can have an effect on which way the source voltage will swing, but by sensing through BLT1 and BLT2 the resistance of resistive elements 51 and 66 affect the output of the inverting amplifier and not the resistance of the select transistors 55 and 60. The output voltage VO will become a logic low voltage equal to about VCM−G*I(R51−R66), where G is the gain of amplifier 90.

Figure 10:
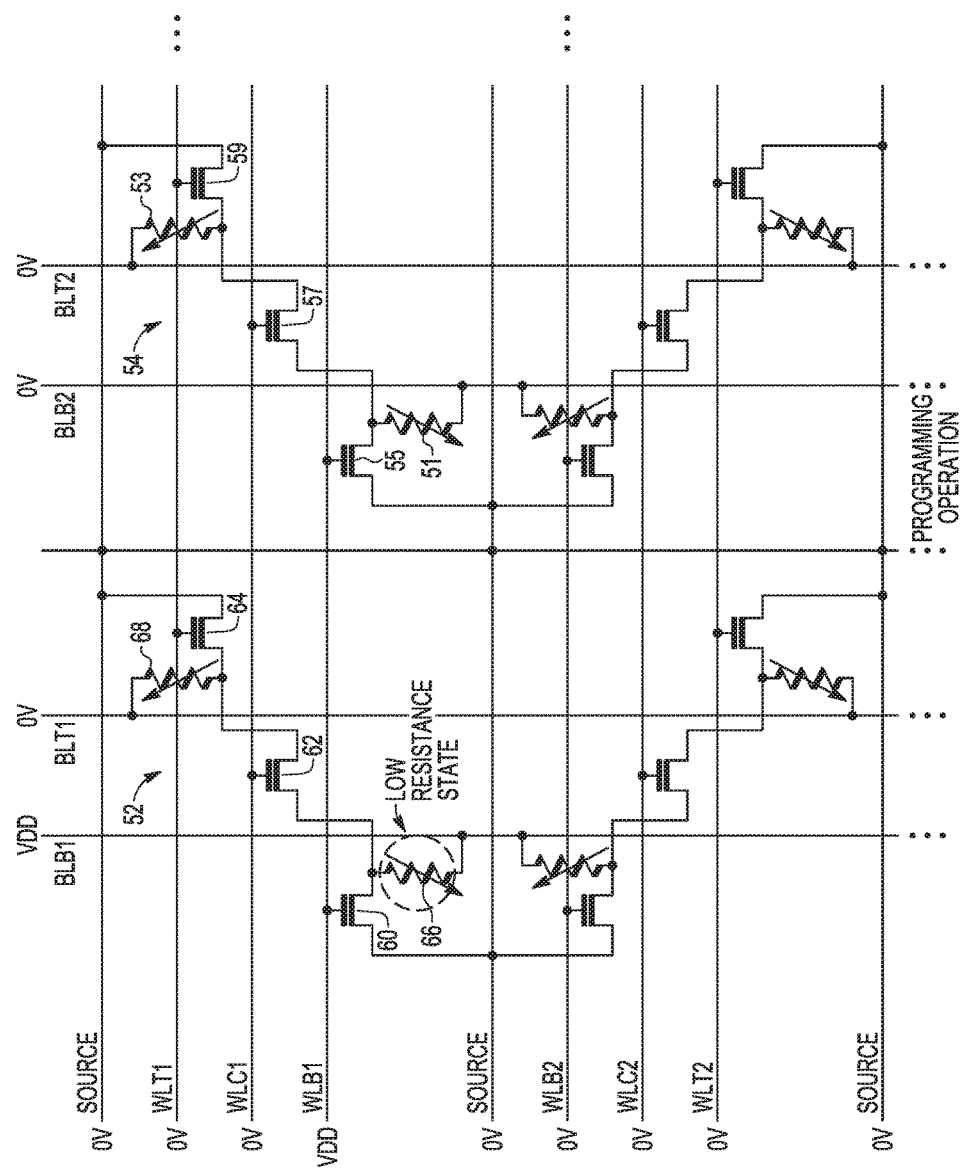
FIG. 10 illustrates the voltages used to program a low resistance state in a resistive element in accordance with an embodiment.

FIG. 10 illustrates the voltages used to program a low resistance state in resistive element 66 in accordance with an embodiment. As can be seen in FIG. 10, the source line SOURCE is at ground, or zero volts. Top word line WLT1 and center word line WLC1 are at ground, so that the center transistor 62 is substantially non-conductive, and bottom word line WLB1 is at the power supply voltage VDD. Bottom bit line BLB1 is at VDD and top bit line BLT1 is at zero volts. The other bit lines of the array are at zero volts. Therefore, transistors 62 and 64 are non-conductive and transistor 60 is conductive. Current will flow through resistive element 66 in a direction that will change the resistance state to a low resistance state.

Figure 11:
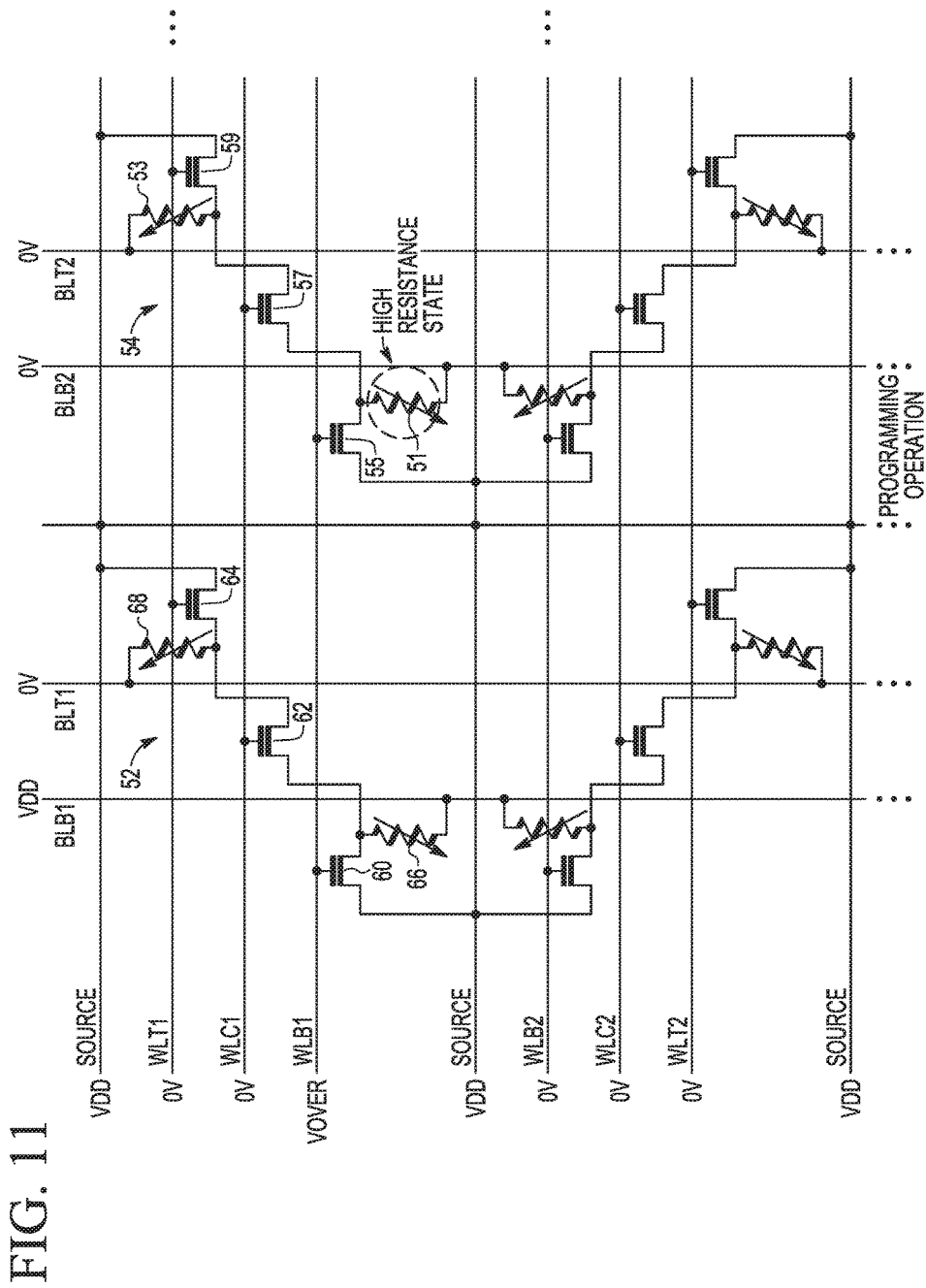
FIG. 11 illustrates the voltages used to program a high resistance state in a resistive element in accordance with an embodiment.

FIG. 11 illustrates the voltages used to program a high resistance state in a resistive element 51 in accordance with an embodiment. In FIG. 11, the source line SOURCE is at VDD and bottom word line WLB1 is at a voltage VOVER that is higher than VDD. The word line can be overdriven without overstressing devices on the unselected word lines. Top word line WLT1 and Center word line WVC1 are at zero volts. Because the source line is a VDD, bottom bit line BLB1 is also at VDD to prevent an unwanted resistance change to resistive element 66. Bottom bit line BLB2 and top bit line BLT2 are at zero volts. All of the other word lines and bit lines are at zero volts. The voltage drop across resistive element 51 will change the resistance of resistive element 51 to a high resistive state.

The illustrated embodiments provide the advantage of more reliable read operations. In addition, read disturb is controlled better by controlling the reference voltage VR with an offset voltage (Δ) across the resistive MTJ elements. The relatively low probability of read disturb insures reliable read operation over the expected number of read operations. Also, current is limited during read operations to the selected columns. In addition, the advantages of differential data storage are provided.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims. Generally, in the above described embodiment, a current electrode is a source or drain and a control electrode is a gate of a metal-oxide semiconductor (MOS) transistor. Other transistor types may be used in other embodiments.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first", "second", "top", "center", and "bottom" are used to arbitrarily to distinguish between the elements such terms describe. Thus, these terms are not necessarily intended to indicate temporal or other prioritization of such elements.

What is claimed is:

1. A memory comprising:
   a plurality of resistive non-volatile memory (RNVM) cells, each RNVM cell comprising:
   a first transistor having a first current element coupled to a first conductor, a control electrode coupled to a second conductor, and a second current electrode;
   a second transistor having a first current electrode coupled to the second current electrode of the first transistor, a control electrode coupled to a third conductor, and a second current electrode;
   a third transistor having a first current electrode coupled to the second current electrode of the second transistor, a control electrode coupled to a fourth conductor, and a second current electrode coupled to a fifth conductor;
   a first RNVM element having a first terminal coupled to a sixth conductor, and a second terminal coupled to the second current electrode of the first transistor; and
   a second RNVM element having a first terminal coupled to the first current electrode of the third transistor, and a second terminal coupled to a seventh conductor,
   wherein the second transistor is conductive during one operation and the second transistor is substantially non-conductive during a different operation.

2. The memory of claim 1, wherein the first and fifth conductors are characterized as being bit lines, the second, third, and fourth conductors are characterized as being word lines, and the sixth and seventh conductors are characterized as being source lines.

3. The memory of claim 2, wherein a read operation of the memory has a calibration phase and a sense phase, wherein during the calibration phase the first, second, and third transistors are conductive, a reference voltage is applied to both source lines, and wherein during the sense phase, the first, second, and third transistors are conductive, and one source line has the reference voltage plus an offset voltage and the other source line has the reference voltage minus the offset.

4. The memory of claim 2, further comprising a first capacitor coupled to the first conductor, and a second capacitor coupled to the fifth conductor.

5. The memory of claim 4, further comprising an amplifier coupled to the first and second capacitors.

6. The memory of claim 1, wherein the first and fifth conductors are characterized as being source lines, the second, third, and fourth conductors are characterized as being word lines, the sixth conductor is characterized as being a first bit line and seventh conductor is characterized as being a second bit line.

7. The memory of claim 6, further comprising a capacitor, wherein first and second bit lines are selectively coupled to a capacitor.

8. The memory of claim 7, wherein during a read operation of a memory cell, the read operation having a first phase and a second phase, wherein during the first phase one of the first bit line or the second bit line are coupled to the capacitor while the other bit line is coupled to ground, and during the second phase a third bit line of a reference memory cell is coupled to the capacitor while a fourth bit line of the reference memory cell is coupled to ground.

9. The memory of claim 7, further comprising an amplifier coupled to the capacitor.

10. The memory of claim 1, wherein the first and second RNVM elements each comprise magnetic tunnel junctions.

11. A memory comprising:
a plurality of resistive non-volatile memory (RNVM) cells organized in rows and columns, each of the RNVM cells comprising first, second, and third transistors and first and second resistive elements, the first, second, and third transistors coupled together in series, wherein a control electrode of each of the first, second, and third transistors is coupled to one of first, second, and third word lines, a current electrode of the first transistor is coupled to a first conductor and a current electrode of the third transistor is coupled to a second conductor, a first terminal of the first resistive element is coupled to a first junction between the first and second transistors and a first terminal of the second resistive element is coupled to a second junction between the second and third transistors, a second terminal of the first resistive element is coupled to a third conductor and a second terminal of the second resistive element is coupled to a fourth conductor, wherein the second transistor is conductive during one operation and the second transistor is substantially non-conductive during a different operation; and
an output circuit coupled to the plurality of RNVM cells for providing output data during a read operation of the memory.

12. The memory of claim 11, wherein the first and second conductors are characterized as being first and second bit lines, respectively, and the third and fourth conductors are characterized as being source lines.

13. The memory of claim 11, wherein the first and second conductors are characterized as being source lines, and the third and fourth conductors are characterized as being bit lines.

14. The memory of claim 11, wherein the first and second resistive elements each comprise magnetic tunnel junctions.

15. The memory of claim 11, further comprising a read operation having a first phase and a second phase, wherein during the first phase a reference voltage is set on a capacitor, and during the second phase a voltage corresponding to a stored state is provided to the capacitor.

16. The memory of claim 11, wherein the first and second conductors are each a bit line, and further comprising a first capacitor coupled to the first conductor and a second capacitor coupled to the second conductor.

17. The memory of claim 11, wherein the third and fourth conductors are each a bit line, and the memory further comprising a capacitor selectively coupled to one of the third and fourth conductors.

18. A memory comprising:
a plurality of non-volatile memory cells organized in rows and columns, each memory cell comprising:
a first transistor having a first current element coupled to a first conductor, a control electrode coupled to a second conductor, and a second current electrode;
a second transistor having a first current electrode coupled to the second current electrode of the first transistor, a control electrode coupled to a third conductor, and a second current electrode;
a third transistor having a first current electrode coupled to the second current electrode of the second transistor, a control electrode coupled to a fourth conductor, and a second current electrode coupled to a fifth conductor;
a first magnetic tunnel junction (MTJ) element having a first terminal coupled to a sixth conductor, and a second terminal coupled to the second current electrode of the first transistor; and
a second MTJ element having a first terminal coupled to the first current electrode of the third transistor, and a second terminal coupled to a seventh conductor,
wherein the second transistor is conductive during one operation and the second transistor is substantially non-conductive during a different operation; and
an output circuit coupled to the plurality of non-volatile memory cells, the output circuit comprising a capacitor selectively coupled to one of the first and second MTJ elements of a memory cell selected for a read operation.

19. The memory of claim 18, wherein the first and fifth conductors are characterized as being bit lines, the second, third, and fourth conductors are characterized as being word lines, and the sixth and seventh conductors are characterized as being source lines.

20. The memory of claim 1, wherein the first and fifth conductors are characterized as being source lines, the second, third, and fourth conductors are characterized as being word lines, the sixth conductor is characterized as being a first bit line and seventh conductor is characterized as being a second bit line.

* * * * *